(12) United States Patent
Ando (10) Patent No.: US 11,447,661 B2
(45) Date of Patent: Sep. 20, 2022

(54) METHOD FOR PRODUCING ALUMINUM PLATTER

(71) Applicant: Kao Corporation, Tokyo (JP)

(72) Inventor: Keisuke Ando, Wakayama (JP)

(73) Assignee: KAO CORPORATION, Tokyo (JP)

( * ) Notice: Subject to any disclaimer, the term of this patent is extended or adjusted under 35 U.S.C. 154(b) by 0 days.

(21) Appl. No.: 16/958,361

(22) PCT Filed: Dec. 27, 2017

(86) PCT No.: PCT/JP2017/047086
§ 371 (c)(1),
(2) Date: Jun. 26, 2020

(87) PCT Pub. No.: WO2019/130516
PCT Pub. Date: Jul. 4, 2019

(65) Prior Publication Data
US 2021/0062044 A1 Mar. 4, 2021

(51) Int. Cl.
*G11B 5/73* (2006.01)
*C23C 14/02* (2006.01)
(Continued)

(52) U.S. Cl.
CPC ............... *C09G 1/04* (2013.01); *C23C 14/02* (2013.01); *C23C 14/028* (2013.01); *C23C 14/34* (2013.01);
(Continued)

(58) Field of Classification Search
None
See application file for complete search history.

(56) References Cited

U.S. PATENT DOCUMENTS

| 2006/0096496 A1* | 5/2006 | Sun .................. C09G 1/02 106/3 |
| 2011/0084787 A1 | 4/2011 | Fujii et al. |

(Continued)

FOREIGN PATENT DOCUMENTS

| CN | 102043332 A | 5/2011 |
| CN | 102245750 A | 11/2011 |

(Continued)

OTHER PUBLICATIONS

International Search Report (PCT/ISA/210) issued in PCT/JP2017,047086, dated Apr. 10, 2018.

(Continued)

*Primary Examiner* — Jefferson A Evans
(74) *Attorney, Agent, or Firm* — Birch, Stewart, Kolasch & Birch, LLP (57) ABSTRACT

In one aspect, the present disclosure provides a method for producing an aluminum platter, which can improve the smoothness of the substrate surface before a magnetic layer is formed thereon and can provide a hard disk substrate that can be processed into a medium with a high yield. In another aspect, the present disclosure relates to a method for producing an aluminum platter, including the following steps 1 and 2: step 1: bringing a composition containing a compound (component A) that has at least one structure represented by the following formula (I) and has a molecular weight between 50 and 100,000 inclusive into contact with

(Continued)

Bringing a composition containing a component A into contact with a substrate surface of a Ni-P plated aluminum alloy substrate — S1

Forming a magnetic layer on the substrate — S2 a substrate surface of a Ni—P plated aluminum alloy substrate; and step 2: forming a magnetic layer on the substrate obtained in the step 1.

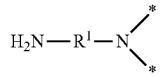

(I)

14 Claims, 1 Drawing Sheet

(51) Int. Cl.
    *C09G 1/04*     (2006.01)
    *C23C 14/34*     (2006.01)
    *G11B 5/84*     (2006.01)

(52) U.S. Cl.
    CPC ........ G11B 5/73919 (2019.05); G11B 5/8404 (2013.01)

(56) References Cited

U.S. PATENT DOCUMENTS

| | | | |
|---|---|---|---|
| 2011/0155690 A1* | 6/2011 | Yamaguchi | C09K 3/1463 216/22 |
| 2011/0171415 A1* | 7/2011 | Eda | C03C 21/008 428/64.2 |
| 2011/0203186 A1* | 8/2011 | Oshima | C03C 19/00 51/298 |
| 2011/0240594 A1* | 10/2011 | Hamaguchi | C23F 3/00 216/22 |
| 2011/0245127 A1 | 10/2011 | Suzuki et al. | |
| 2012/0156968 A1* | 6/2012 | Kimura | B24B 37/044 451/36 |
| 2015/0197669 A1* | 7/2015 | Palanisamy Chinnathambi | C09C 1/3054 216/22 |
| 2015/0318017 A1 | 11/2015 | Aono et al. | |
| 2016/0288290 A1* | 10/2016 | Li | B24B 37/048 |
| 2019/0119423 A1* | 4/2019 | Iwata | C08F 220/06 |
| 2019/0153262 A1* | 5/2019 | Zhang | G11B 5/8404 |

FOREIGN PATENT DOCUMENTS

| | | |
|---|---|---|
| CN | 102265339 A1 * | 11/2011 |
| CN | 102337080 A1 * | 2/2012 |
| CN | 103805068 A | 5/2014 |
| CN | 104877811 A | 9/2015 |
| CN | 105074823 A | 11/2015 |
| CN | 105493184 A | 4/2016 |
| CN | 106716532 A | 5/2017 |
| JP | 2010-257510 A | 11/2010 |
| JP | 2011-46807 A | 3/2011 |
| JP | 5403890 B2 | 1/2014 |
| JP | 2014-101410 A | 6/2014 |
| JP | 2015-63677 A | 4/2015 |
| JP | 2015-170373 A | 9/2015 |
| JP | 2017-50039 A | 3/2017 |
| JP | 2017-199448 A | 11/2017 |
| JP | 2017-222840 A | 12/2017 |
| TW | 201434776 A | 9/2014 |
| WO | WO 2010070819 A1 * | 6/2010 |
| WO | WO 2017/212827 A1 | 12/2017 |

OTHER PUBLICATIONS

Chinese Office Action and Search Report for Chinese Application No. 201780097992.6. dated Mar. 11, 2021, with English translation of the Office Action.

Chinese Office Action and Search Report (including an English translation thereof) issued in the corresponding Chinese Patent Application No. 201780097992.6 dated Sep. 23, 2021.

* cited by examiner

METHOD FOR PRODUCING ALUMINUM PLATTER

TECHNICAL FIELD

The present disclosure relates to a method for producing an aluminum platter, a smoothing agent composition, and a smoothing method.

BACKGROUND ART

In recent years, personal computers and various electronic devices have come to handle large data such as moving images and audio, which has created demand for large-capacity information recording devices. As a result, demand for information recording media with higher recording density is growing year by year. In order to cope with this demand, adoption of perpendicular magnetic recording in hard disks and mass production of such hard disks has advanced. In perpendicular magnetic recording, a substrate for an information recording medium (hereinafter also referred to as "hard disk substrate") is required to have a higher level of surface smoothness than currently used substrates. This is because a magnetic body has to be miniaturized in order to increase the recording density, and since the magnetic force of the magnetic body is reduced as a result of the miniaturization, a recording/reading head has to be brought even closer to the hard disk substrate. Minute irregularities on the surface of the substrate thus may cause a reduction in reliability and an increase in the defective rate of an information recording device, whereas conventionally, such minute irregularities were not a problem. Accordingly, high smoothness and high cleanliness are required for a surface of a hard disk substrate.

Examples of the material used for a hard disk substrate include aluminum and glass each having a nickel-phosphorus plated surface. Aluminum, which has higher workability than glass, can reduce the production cost, and thus is widely used.

Patent Literature 1 discloses a cleaner composition for cleaning a hard disk substrate provided with an Ni—P-containing layer. The cleaner composition contains a specific acrylic acid copolymer compound and/or a salt thereof (component (A)), polyamine (component (B)), and water (component (C)) and is substantially free of a nonionic surfactant. The content of the component (B) is 30 to 95 wt % of the total weight of the components other than the component (C), and the weight ratio between the component (A) and the component (B) {component (A)/component (B)} is 0.04 to 0.8.

Patent Literature 2 discloses a magnetic disk substrate cleaner for use in a scrub cleaning step, containing an anionic surfactant (A) and/or a chelating agent (B). The content of alkali metal cations relative to the weight of the magnetic disk substrate cleaner is 100 ppm or less, and the pH of a solution obtained by diluting the cleaner to 5 wt % is 7.0 to 12.5 at 25° C.

Patent Literature 3 discloses a cleaner composition for hard disk substrates. The cleaner composition contains a component (A): 0.01 to 5.00 mass % of an alkali metal hydroxide, a component (B): 0.10 to 20.00 mass % of 1-hydroxyethane-1,1-diphosphonic acid and/or a salt thereof and a component (C): 0.05 to 10.00 mass % of polyoxyethylene alkylether sulfate, and the content of a surfactant is less than 1.00 mass %.

Patent Literature 4 discloses a cleaning solution for electronic material substrates. The cleaning solution contains a water-soluble amine (A), has a pH of 10.5 to 11.6 at 25° C., and satisfies a conditional expression of (the water-soluble amine concentration+0.61)/pH of the cleaning solution≥0.059.

PRIOR ART DOCUMENTS

Patent Documents

Patent Document 1: JP 2010-257510A
Patent Document 2: JP 2015-63677A
Patent Document 3: JP 2011-46807A
Patent Document 4: JP 2017-50039A

DISCLOSURE OF INVENTION

Problem to be Solved by the Invention

A substrate is subjected to precise polishing in a polishing step in order to impart high smoothness to a substrate surface. However, even if the substrate surface is smooth immediately after being polished, the smoothness may be diminished due to adhesion of foreign substances or oxidation of the substrate surface during storage or transportation before a magnetic layer is formed thereon (hereinafter formation of the magnetic layer is also referred to as "processing into a medium").

In light of the foregoing, in one aspect, the present disclosure provides a method for producing an aluminum platter, which can improve the smoothness of the substrate surface before a magnetic layer is formed thereon and can provide a hard disk substrate that can be processed into a medium with a high yield.

Means for Solving the Problem

In one aspect, the present disclosure relates to a method for producing an aluminum platter, including the following steps 1 and 2:

step 1: bringing a composition containing a compound (component A) that has at least one structure represented by the following formula (I) and has a molecular weight between 50 and 100,000 inclusive into contact with a substrate surface of a Ni—P plated aluminum alloy substrate; and step 2: forming a magnetic layer on the substrate obtained in the step 1.

In the formula (I), $R^1$ is at least one selected from an ethylene group, a propylene group, and an isopropylene group, and * represents a bond.

In another aspect, the present disclosure relates to a smoothing agent composition for smoothing a substrate surface on which a magnetic layer is to be formed, containing:

a compound (component A) that has at least one structure represented by the formula (I) and has a molecular weight between 50 and 100,000 inclusive.

(I)

In the formula (I), $R^1$ is at least one selected from an ethylene group, a propylene group, and an isopropylene group, and * represents a bond.

In still another aspect, the present disclosure relates to a smoothing method for smoothing a substrate surface using the smoothing agent composition according to the present disclosure.

Effects of the Invention

In one aspect, according to the present disclosure, the smoothness of a substrate surface before a magnetic layer is formed thereon can be improved and a hard disk substrate that can be processed into a medium with a high yield can be obtained.

DESCRIPTION OF THE INVENTION

Figure 1:
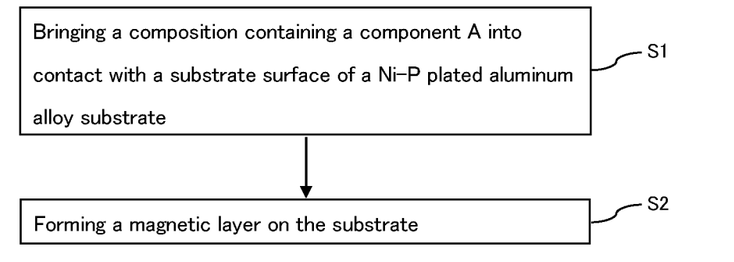
The FIGURE is a flow chart illustrating the methodology step ordering according to the present invention, where S1 denotes a methodology step of bringing a composition containing a component A into contact with a substrate surface of a Ni—P plated aluminum alloy substrate, and wherein S2 denotes a methodology step of forming a magnetic layer on the substrate.

The present disclosure is based on the finding that, by using a smoothing agent composition containing a predetermined compound (component A) to smooth a substrate surface whose smoothness has been diminished as compared with that immediately after being polished, the smoothness of the substrate surface before a magnetic layer is formed thereon can be improved, whereby a hard disk substrate that can be processed into a medium with a high yield can be obtained.

That is, in one aspect, the present disclosure relates to a method for producing an aluminum platter, including the following steps 1 and 2 (hereinafter the method is also referred to as "the production method according to the present disclosure"):

step 1: bringing a composition containing a compound (component A) that has at least one structure represented by the following formula (I) and has a molecular weight between 50 and 100,000 inclusive (hereinafter this composition is also referred to as "the composition according to the present disclose") into contact with a substrate surface of a Ni—P plated aluminum alloy substrate; and step 2: forming a magnetic layer on the substrate obtained in the step 1.

Although the details of the mechanism by which the effects of the present disclosure are exhibited are not clear, it is speculated as follows.

Unlike a glass substrate, in an aluminum hard disk substrate, a nickel phosphorus amorphous layer plated on the surface of the substrate reacts with oxygen in the air and thus oxidizes when exposed to air. As a result, the surface becomes non-uniform owing to the influence of unevenness in the ratio between nickel and phosphorus on the surface and the presence of irregularities, whereby the surface smoothness is likely to be diminished.

Typically, a hard disk substrate can be produced by subjecting a base material to be processed into a hard disk substrate to a shaping step, a rough grinding step, a fine grinding step, a rough polishing step, a finish polishing step, and the like. Cleaning steps may be included between the respective steps. Then, the hard disk substrate is dried completely once after the finish polishing step or the final cleaning step. Thereafter, in a platter producing step, a magnetic layer is formed on a surface of the substrate to produce a magnetic hard disk (platter). A factory where the polishing steps and the cleaning steps are performed is usually different from a factory where the platter producing step is performed. Accordingly, the hard disk substrate obtained after the finish polishing step or the final cleaning step is brought to where the platter producing step is performed after having been subjected to a storage step and/or a transportation step.

Although a hard disk substrate immediately after being polished (e.g., a hard disk substrate obtained after a finish polishing step or a final cleaning step) has a substrate surface with high smoothness, the substrate surface may be oxidized by oxygen in the air during storage and/or transportation before the substrate is brought to where the platter producing step is performed, whereby a non-uniform oxide film is formed on the substrate surface and the smoothness is diminished. In addition, the smoothness may also be diminished due to foreign substances, such as dust, adhering to the substrate surface during storage or transportation. As described above, the substrate brought to where the platter producing step is performed tends to have a diminished smoothness as compared with that of the substrate surface immediately after being polished. If the smoothness of the substrate surface is diminished, it is difficult to form a uniform magnetic layer on the substrate surface in the platter producing step. It is considered that this reduces the recording density of a hard disk substrate to be obtained, and in addition, irregularities present on the substrate surface may cause the substrate to collide with a magnetic head and render record reading and writing incomplete, thereby making the hard disk substrate a defective product. As a result, the production yield is reduced.

In contrast, in the present disclosure, a nitrogen atom, especially an amino group, in the specific component A contained in the composition reduces nickel oxide formed on a substrate surface and causes the nickel oxide to be dissolved in the composition. It is presumed that this removes the oxide film on the substrate surface, which is one cause of diminishing of the smoothness of the substrate surface before a magnetic layer is formed thereon, whereby a smooth surface is reinstated or newly formed.

The component A has two or more nitrogen atoms. Thus, it is considered that the nitrogen atoms form coordinate bonds with a metal, such as nickel, from which polyvalent metal ions are derived, thereby forming a chelate having a cyclic structure such as a five-membered ring or a six-membered ring. Since the chelate structure is stable when it is a cyclic structure such as a five-membered ring or a six-membered ring, it is expected that the dissolution of the nickel oxide is promoted and the oxide film is removed more effectively.

Further, it is speculated that the component A is adsorbed onto foreign substances, such as dust, adhering to a substrate surface, which is another cause of diminishing of the smoothness of the substrate surface before a magnetic layer is formed thereon, thereby causing electric charge repulsion between the substrate surface and the foreign substances and thus removing the foreign substances from the substrate surface.

When the composition according to the present disclosure further contains a chelating agent (component B), it is expected that the reduction of nickel oxide described above occurs more effectively or the dissolved nickel can be stably kept in the composition due to chelating, and also foreign substances on the substrate surface can be removed more effectively.

It is to be noted, however, that the present disclosure should not be construed as being limited by these mechanisms.

<Composition>

[Component A]

The component A contained in the composition according to the present disclosure is a compound that has at least one structure represented by the following formula (I) and has a molecular weight between 50 and 100,000 inclusive. One type of component A may be used, or a mixture of two or more types of components A may be used.

(I)

In the formula (I), $R^1$ is at least one selected from an ethylene group, a propylene group, and an isopropylene group, and * represents a bond. In one or more embodiments, * represents a bond with another structure or another atom. Another structure may be, for example, an organic group. Another atom may be, for example, at least one selected from a hydrogen atom, a halogen atom, and a metal. * may also be referred to as a binding position, a binding site, or a binding point.

In the component A, the number of nitrogen atoms in a molecule is preferably two or more from the viewpoint of improving smoothness, and is preferably 1300 or less, more preferably 1000 or less, still more preferably 100 or less, yet more preferably 10 or less, and even more preferably 4 or less from the viewpoint of the solubility of nickel oxide.

In the component A, the number of amino groups in a molecule is preferably one or more and more preferably two or more from the viewpoint of improving smoothness, and is preferably 500 or less, more preferably 30 or less, and still more preferably 10 or less from the viewpoint of the solubility of nickel oxide.

The component A is preferably at least one selected from a compound represented by the formula (II) and polyethyleneimine from the viewpoint of improving smoothness.

(II)

In the formula (II), $R^1$ is at least one selected from an ethylene group, a propylene group, and an isopropylene group, and $R^2$ and RP are each independently at least one selected from a hydrogen atom, a methyl group, an ethyl group, a hydroxymethyl group, a hydroxyethyl group, a hydroxypropyl group, an aminoethyl group, an aminopropyl group, and a —$(CH_2)_2NH(CH_2)_2NH_2$ group.

Examples of the compound represented by the formula (II) used as the component A include: amino alcohols such as N-(β-aminoethyl)ethanolamine and N-(β-aminoethyl)isopropanolamine; and amines such as ethylenediamine, N-ethylethylenediamine, 1,2-propanediamine, 1,3-propanediamine, N,N-bis(aminopropyl)methylamine, diethylenetriamine, and triethylenetetramine.

In one or more embodiments, from the viewpoint of improving smoothness, the component A is preferably at least one selected from N-(β-aminoethyl)ethanolamine, N-(β-aminoethyl)isopropanolamine, ethylenediamine, N-ethylethylenediamine, 1,2-propanediamine, 1,3-propanediamine, diethylenetriamine, triethylenetetramine, and polyethyleneimine, more preferably at least one selected from N-(β-aminoethyl)ethanolamine, N-(β-aminoethyl)isopropanolamine, ethylenediamine, N-ethylethylenediamine, 1,2-propanediamine, diethylenetriamine, triethylenetetramine, and polyethyleneimine, and still more preferably at least one selected from N-(β-aminoethyl)ethanolamine, N-(β-aminoethyl)isopropanolamine, ethylenediamine, N-ethylethylenediamine, 1,2-propanediamine, and diethylenetriamine.

In one or more other embodiments, from the viewpoint of obtaining smoothness in a short period of time, the component A is preferably at least one selected from N-(β-aminoethyl)ethanolamine, N-(β-aminoethyl)isopropanolamine, ethylenediamine, N-ethylethylenediamine, 1,2-propanediamine, diethylenetriamine, triethylenetetramine, and polyethyleneimine, more preferably at least one selected from N-(β-aminoethyl)ethanolamine, N-(β-aminoethyl)isopropanolamine, ethylenediamine, N-ethylethylenediamine, and 1,2-propanediamine, still more preferably at least one selected from N-(β-aminoethyl)ethanolamine, aminoethyl)isopropanolamine, ethylenediamine, and N-ethylethylenediamine, and yet more preferably N-(β-aminoethyl)ethanolamine and/or NO-aminoethyl)isopropanolamine.

In one or more other embodiments, from the viewpoint of obtaining a smoother substrate surface, the component A is preferably at least one selected from N-(β-aminoethyl)ethanolamine, N-(β-aminoethyl)isopropanolamine, ethylenediamine, N-ethylethylenediamine, 1,2-propanediamine, diethylenetriamine, triethylenetetramine, and polyethyleneimine, more preferably at least one selected from N-(β-aminoethyl)isopropanolamine, N-ethylethylenediamine, 1,2-propanediamine, and diethylenetriamine, still more preferably at least one selected from N-(β-aminoethyl)isopropanolamine, N-ethylethylenediamine, 1,2-propanediamine, and diethylenetriamine and, and yet more preferably NO-aminoethyl)isopropanolamine and/or 1,2-propanediamine.

The molecular weight of the component A is preferably 50 or more from the viewpoint of improving smoothness, and is 100,000 or less, preferably 70,000 or less, more preferably 10,000 or less, still more preferably 2,000 or less, and yet more preferably 1,000 or less from the viewpoint of the solubility of nickel oxide.

When the component A is polyethyleneimine, the weight-average molecular weight of the component A is preferably 50 or more from the viewpoint of improving smoothness, and is preferably 70,000 or less, more preferably 10,000 or less, and still more preferably 2,000 or less from the viewpoint of the solubility of nickel oxide. In the present disclosure, the weight-average molecular weight can be measured through gel permeation chromatography (GPC) under the following conditions using a liquid chromatograph (Hitachi, Ltd., L-6000 High Performance Liquid Chromatograph).

<Conditions of GPC>
Sample solution: solution having a concentration adjusted to 0.5 g/100 mL
Detector: Shodex RI SE-61 differential refractive index detector
Column: use of G4000PWXL and G2500PWXL (both manufactured by Tosoh Corp.) connected in series
Eluent: 0.2 M phosphate buffer solution/acetonitrile=90/10 (volume ratio)
Column temperature: 40° C.
Flow rate: 1.0 mL/min
Ejection volume of sample solution: 20 μL
Standard polymer: monodispersed polyethylene glycol with a known molecular weight In one or more embodiments, the content of the component A when the composition according to the present disclosure is in use is preferably 0.01 mass % or more, more preferably 0.03 mass % or more, and still more preferably 0.1 mass % or more from the viewpoint of obtaining smoothness in a short period of time, and is preferably 1.0 mass % or less, more preferably 0.5 mass % or less, still more preferably 0.3 mass % or less, and yet more preferably 0.2 mass % or less from the same viewpoint. Moreover, the content of the component A when the composition according to the present disclosure is in use is preferably between 0.01 mass % and 1.0 mass % inclusive, more preferably between 0.03 mass % and 0.5 mass % inclusive, still more preferably between 0.1 mass % and 0.3 mass % inclusive, and yet more preferably between 0.1 mass % and 0.2 mass % inclusive from the same viewpoint.

In one or more other embodiments, the content of the component A when the composition according to the present disclosure is in use is preferably 0.01 mass % or more, more preferably 0.03 mass % or more, and still more preferably 0.05 mass % or more from the viewpoint of obtaining a smoother substrate surface, and is preferably 1.0 mass % or less, more preferably 0.5 mass % or less, still more preferably 0.3 mass % or less, and yet more preferably 0.1 mass % or less from the same viewpoint. Moreover, the content of the component A when the composition according to the present disclosure is in use is preferably between 0.01 mass % and 1.0 mass % inclusive, more preferably between 0.03 mass % and 0.5 mass % inclusive, still more preferably between 0.05 mass % and 0.3 mass % inclusive, and yet more preferably between 0.05 mass % and 0.1 mass % inclusive from the same viewpoint.

In the present disclosure, "the content of each component when the composition is in use" refers to, in one or more embodiments, the content of each component in the composition used in the step 1.

[Component B: Chelating Agent]
The composition according to the present disclosure may contain a chelating agent (component B) from the viewpoint of improving smoothness. One type of component B may be used, or a mixture of two or more types of components B may be used.

The chelating agent used as the component B may be, for example, at least one selected from the group consisting of aldonic acids such as gluconic acid and glucoheptonic acid; aminocarboxylic acids such as ethylenediaminetetraacetic acid and diethylenetriaminepentaacetic acid; hydroxycarboxylic acids such as citric acid and malic acid; phosphonic acids such as 1-hydroxyethylidene-1,1-diphosphonic acid; thiocarboxylic acids such as thioglycolic acid; amino acids such as glycine; salts thereof and acetylacetone. Examples of the salts include alkali metals, alkaline earth metals, and ammonium.

In one or more embodiments, from the viewpoint of improving smoothness, the component B is preferably at least one selected from the group consisting of gluconic acid, ethylenediaminetetraacetic acid, diethylenetriaminepentaacetic acid, citric acid, 1-hydroxyethylidene-1,1-diphosphonic acid, thioglycolic acid, glycine, salts thereof and acetylacetone, more preferably at least one selected from the group consisting of gluconic acid, ethylenediaminetetraacetic acid, diethylenetriaminepentaacetic acid, 1-hydroxyethylidene-1,1-diphosphonic acid, thioglycolic acid, glycine, and salts thereof, and still more preferably at least one selected from the group consisting of ethylenediaminetetraacetic acid, diethylenetriaminepentaacetic acid, thioglycolic acid, glycine, and salts thereof.

In one or more other embodiments, from the viewpoint of obtaining the smoothness in a short period of time, the component B is preferably at least one selected from the group consisting of gluconic acid, ethylenediaminetetraacetic acid, diethylenetriaminepentaacetic acid, citric acid, 1-hydroxyethylidene-1,1-diphosphonic acid, thioglycolic acid, glycine, salts thereof, and acetylacetone, more preferably at least one selected from the group consisting of gluconic acid, ethylenediaminetetraacetic acid, diethylenetriaminepentaacetic acid, 1-hydroxyethylidene-1,1-diphosphonic acid, thioglycolic acid, glycine, and salts thereof, and still more preferably at least one selected from the group consisting of ethylenediaminetetraacetic acid, diethylenetriaminepentaacetic acid, glycine, and salts thereof.

In one or more other embodiments, from the viewpoint of obtaining a smoother substrate surface, the component B is preferably at least one selected from the group consisting of gluconic acid, ethylenediaminetetraacetic acid, diethylenetriaminepentaacetic acid, citric acid, 1-hydroxyethylidene-1,1-diphosphonic acid, thioglycolic acid, glycine, salts thereof, and acetylacetone, more preferably at least one selected from the group consisting of gluconic acid, ethylenediaminetetraacetic acid, diethylenetriaminepentaacetic acid, citric acid, thioglycolic acid, glycine, and salts thereof and still more preferably at least one selected from the group consisting of ethylenediaminetetraacetic acid, thioglycolic acid, glycine, and salts thereof.

The content of the component B when the composition according to the present disclosure is in use is preferably 0.001 mass % or more, more preferably 0.005 mass % or more, and still more preferably 0.01 mass % or more from the viewpoint of improving smoothness, and is preferably 0.2 mass % or less, more preferably 0.1 mass % or less, still more preferably 0.05 mass % or less, and yet more preferably 0.02 mass % or less from the viewpoint of improving smoothness and reducing the load on wastewater treatment.

Moreover, the content of the component B when the composition according to the present disclosure is in use is preferably between 0.001 mass % and 0.2 mass % inclusive, more preferably between 0.005 mass % and 0.1 mass % inclusive, still more preferably between 0.01 mass % and 0.05 mass % inclusive, and yet more preferably between 0.01 mass % and 0.02 mass % inclusive from the same viewpoint.

[Component C: Water]

The composition according to the present disclosure may further contain water (component C). The water used as the component C is not particularly limited as long as it can serve as a solvent, and may be, for example, ultrapure water, pure water, ion-exchanged water, or distilled water. The water is preferably ultrapure water, pure water, or ion-exchanged water, and more preferably ultrapure water. Pure water and ultrapure water can be obtained by, for example, passing tap water through activated carbon, subjecting the water to ion exchange treatment, further distilling the water, and then, as necessary, irradiating the water with a predetermined ultraviolet sterilization lamp or passing the water through a filter.

The content of the component C when the composition according to the present disclosure is in use is preferably 90 mass % or more, more preferably 95 mass % or more, still more preferably 99 mass % or more from the viewpoint of improving smoothness and stabilizing the composition, and is preferably 99.99 mass % or less, more preferably 99.9 mass % or less, and still more preferably 99.8 mass % or less from the same viewpoint.

[Component D: Alkali Agent]

The composition according to the present disclosure may further contain an alkali agent (component D) other than the component A. One type of component D may be used, or a mixture of two or more types of components D may be used.

The alkali agent used as the component D may be a compound that can render the composition according to the present disclosure alkaline or a compound that can adjust the pH of the composition according to the present disclosure to be within the range described above, and is, for example, an inorganic alkali agent or an organic alkali agent. Examples of the inorganic alkali agent used as the component D include: ammonia; and alkali metal hydroxides such as potassium hydroxide and sodium hydroxide. Examples of the organic alkali agent used as the component D include hydroxyalkylamines and quaternary ammonium salts. Examples of the hydroxyalkylamines include monoethanolamine, diethanolamine, triethanolamine, methylethanolamine, methyldiethanolamine, monopropanolamine, dipropanolamine, tripropanolamine, methylpropanolamine, and methyldipropanolamine. Examples of the quaternary ammonium salts include tetramethylammonium hydroxide and choline.

The component D is preferably at least one selected from alkali metal hydroxides, hydroxyalkylamines, and quaternary ammonium salts from the viewpoint of improving smoothness, and is more preferably an alkali metal hydroxide and still more preferably at least one of potassium hydroxide and sodium hydroxide from the viewpoint of reducing the load on wastewater treatment.

The content of the component D when the composition according to the present disclosure is in use may be such that the pH of the composition can be adjusted to be within a range to be described below.

[Other Components]

The composition of the present disclosure may be composed of the components A to D only, or may further contain a component(s) other than the components A to D to the extent that the effects of the present disclosure are not impaired. Examples of the other components include an anionic polymer, a nonionic surfactant, a solubilizer, an antioxidant, an antiseptic agent, an antifoaming agent, and an antibacterial agent. The content of the other component(s) when the composition according to the present disclosure is in use is preferably between 0 mass % and 2.0 mass % inclusive, more preferably between 0 mass % and 1.5 mass % inclusive, still more preferably between 0 mass % and 1.3 mass % inclusive, and yet more preferably between 0 mass % and 1.0 mass % inclusive.

The anionic polymer may be, for example, a carboxylic acid-based polymer. Examples of the carboxylic acid-based polymer include carboxylic acid-based polymers containing a methacrylic acid or an acrylic acid as a structural unit, such as acrylic acid polymers, methacrylic acid polymers, maleic acid polymers, acrylic acid/methacrylic acid copolymers, acrylic acid/maleic acid copolymers, and methacrylic acid/acrylic acid methylester copolymers.

The nonionic surfactant may be, for example, a polyalkylene glycol alkyl ether.

The solubilizing agent may be, for example, at least one selected from p-toluenesulfonic acid, dimethylbenzenesulfonic acid, 2-ethylhexanoic acid, and salts thereof.

The composition according to the present disclosure may further contain an aqueous solvent (e.g., alcohol such as ethanol) as a solvent in addition to the water (component C). However, it is preferable that the composition according to the present disclosure contains only water (component C) as a solvent.

In one or more embodiments, the compositions according to the present disclosure may be substantially free of a polymer other than the component A The content of the polymer other than the component A when the composition according to the present disclosure is in use is preferably less than 0.1 mass %, more preferably less than 0.001 mass %, and still more preferably substantially 0 mass %.

In one or more embodiments, the compositions according to the present disclosure may be substantially free of an anionic surfactant. The content of an anionic surfactant when the composition according to the present disclosure is in use is preferably less than 0.1 mass %, more preferably less than 0.001 mass %, and still more preferably substantially 0 mass %.

In one or more embodiments, the composition according to the present disclosure may be substantially free of a nonionic surfactant. That is, the content of a nonionic surfactant when the composition according to the present disclosure is in use is preferably less than 0.001 mass % and more preferably substantially 0 mass %.

In one or more embodiments, the compositions according to the present disclosure may be substantially free of a compound having an aromatic sulfonic acid group. That is, the content of a compound containing an aromatic sulfonic acid group when the composition according to the present disclosure is in use is preferably less than 0.001 mass % and more preferably substantially 0 mass %.

In one or more embodiments, the composition according to the present disclosure may be substantially free of an abrasive. That is, the content of an abrasive when the composition according to the present disclosure is in use is preferably less than 0.05 mass % and more preferably substantially 0 mass %.

In one or more embodiments, the composition according to the present disclosure may be an aqueous solution. In one or more embodiments, the composition according to the present disclosure is a smoothing agent composition for smoothing a substrate surface on which a magnetic layer is to be formed.

[Method for Producing Composition]

The composition according to the present disclosure can be produced by blending the component A, and the component B, the component C, the component D, and other components as needed using a known method. For example, the composition according to the present disclosure may be obtained by blending at least the component A. The term "blend" as used in the present disclosure encompasses mixing the component A and optionally the component B, the component C, the component D, and other components at the same time or in any order. In the method for producing the composition according to the present disclosure, the amounts of the respective components to be blended may be the same as the above-described contents of the respective components in the composition according to the present disclosure.

[pH of Composition]

The pH of the composition according to the present disclosure in use is preferably 9 or more, more preferably 9.5 or more, still more preferably 10 or more, yet more preferably 10.5 or more, and even more preferably 11.8 or more from the viewpoint of improving smoothness, and is preferably 14 or less, more preferably 13 or less, and still more preferably 12.5 or less from the same viewpoint. More specifically, the pH of the composition according to the present disclosure in use is preferably between 9 and 14 inclusive, more preferably between 9.5 and 14 inclusive, still more preferably between 10 and 14 inclusive, yet more preferably between 10.5 and 14 inclusive, even more preferably between 11.8 and 14 inclusive, even more preferably between 11.8 and 13 inclusive, and even more preferably between 11.8 and 12.5 inclusive. The pH of the composition according to the present disclosure can be adjusted using, for example, an acid or an alkali agent (component D) other than the component A. Examples of the acid include: inorganic acids such as nitric acid, sulfuric acid, and hydrochloric acid; and organic acids such as oxycarboxylic acids and amino acids. In the present disclosure, "pH in use" is the pH of the composition when it is used at 25° C. It can be measured using a pH meter, and preferably is a value read from the pH meter three minutes after dipping the electrode of the pH meter into the composition.

The composition according to the present disclosure may be produced in the form of a concentrate and diluted when it is used, from the viewpoint of storage and transportation of the composition. From the viewpoint of storage and transportation of the composition, the concentrate of the composition is preferably a concentrate to be diluted by a dilution factor of 3 or more, and is preferably a concentrate to be diluted by a dilution factor of 200 or less from the viewpoint of storage stability. The concentrate of the composition can be used after being diluted with water (component C) such that the contents of the respective components fall within the above-mentioned ranges when the composition is in use. Furthermore, the concentrate of the composition can be used by adding the respective components separately when the composition is in use. In the present disclosure, a concentrate "in use" refers to a concentrate in a state where the concentrate of the composition is diluted.

The pH of the concentrate of the composition according to the present disclosure is preferably 9 or more, more preferably 10 or more, still more preferably 11 or more, and yet more preferably 12 or more from the viewpoint of improving smoothness after the composition has been diluted, and is preferably 14 or less, more preferably 13.8 or less, and still more preferably 13.5 or less from the same viewpoint. The pH of the concentrate of the composition according to the present disclosure can be measured in the same manner as that for measuring the pH of the composition according to the present disclosure described above.

[Substrate to be Smoothed]

In one or more embodiments, the composition according to the present disclosure is used for smoothing a substrate surface whose smoothness is diminished as compared with that immediately after being polished. In one or more embodiments, the composition according to the present disclosure is used for smoothing a surface of a substrate that has been stored and/or transported after being polished. The time period required for storage and/or transportation is not constant. In one or more embodiments, the composition according to the present disclosure is used for smoothing a substrate surface on which a magnetic layer is to be formed. In one or more embodiments, the composition according to the present disclosure can be suitably used for smoothing an oxidized surface of a substrate. In one or more embodiments, the composition according to the present disclosure can be suitably used for smoothing a surface of a substrate one hour or more after the surface of the substrate has been polished. The length of time elapsed after polishing is preferably 1 hour or more, more preferably 2 hours or more, still more preferably 5 hours or more, yet more preferably 12 hours or more, even more preferably 20 hours or more, even more preferably 1 day or more, even more preferably 2 days or more, and even more preferably 5 days or more.

The substrate may be a Ni—P plated aluminum alloy substrate. In the present disclosure, "Ni—P plated aluminum alloy substrate that has a diminished smoothness as compared with that immediately after being polished" refers to, in one or more embodiments, a Ni—P plated aluminum alloy substrate stored and/or transported after being polished.

As described above, in one or more embodiments, although the smoothness of a surface of a substrate after being polished may diminish during storage and/or transportation, the smoothness of the surface of the substrate can be improved by using the composition of the present disclosure. Accordingly, in another aspect, the present disclosure relates to a method for smoothing a substrate surface using the composition according to the present disclosure.

In the present disclosure, the term "Ni—P plated aluminum alloy substrate" refers to an aluminum alloy substrate that has been polished and then subjected to electroless Ni—P plating. The shape of the Ni—P plated aluminum alloy substrate may be, for example, a shape having a flat portion, such as a disk shape, a plate shape, a slab shape, or a prism shape, or a shape having a curved portion, such as a lens shape. Of these shapes, a disk shape is suitable. When the substrate has a disk shape, the outer diameter thereof is about 30 to 97 mm and the thickness thereof is about 0.5 to 2 mm.

In the production method according to the present disclosure, prior to the step of forming a magnetic layer, a surface of a substrate on which the magnetic layer is to be formed is smoothed using the composition according to the present disclosure. More specifically, the production method according to the present disclosure includes the following steps 1 and 2 in this order. The respective steps will be described in detail below.

[Step 1]

In one or more embodiments, the step 1 in the production method of the present disclosure is a step of bringing the composition according to the present disclosure into contact with a Ni—P plated aluminum alloy substrate. In one or more embodiments, the step 1 is a step of smoothing a surface of a Ni—P plated aluminum alloy substrate (hereinafter also referred to simply as "substrate to be smoothed") that has a diminished smoothness as compared with that immediately after being polished, using the composition according to the present disclosure (smoothing step).

Examples of the method for bringing the composition according to the present disclosure into contact with the substrate to be smoothed include: immersing the substrate to be smoothed in the composition according to the present disclosure (immersion method); and scrubbing the substrate to be smoothed with the composition according to the present disclosure (scrubbing method). The immersion method and/or scrubbing method may be carried out in the same manner as immersion cleaning and/or scrub cleaning used in conventional cleaning processes. The immersion method and the scrubbing method will be described in detail below.

(Immersion Method)

Conditions for immersing the substrate to be smoothed in the composition are not particularly limited. For example, from the viewpoint of workability and operability, the temperature of the composition is preferably 20° C. to 100° C. For example, the immersion time is preferably 5 seconds or more, more preferably 10 seconds or more, and still more preferably 100 seconds or more from the viewpoint of improving smoothness, and is preferably 30 minutes or less, more preferably 10 minutes or less, and still more preferably 5 minutes or less from the viewpoint of improving the production efficiency of a substrate. From the viewpoint of improving smoothness and promoting the smoothing operation, it is preferable to apply ultrasonic vibrations to the composition. The frequency of the applied ultrasonic waves is, for example, preferably 20 to 2000 kHz, more preferably 40 to 2000 kHz, and still more preferably 100 to 1500 kHz.

(Scrubbing Method)

From the viewpoint of improving smoothness, a preferable scrubbing method is to bring the composition into contact with a surface of a substrate to be smoothed by ejecting the composition under application of ultrasonic vibrations or to supply the composition onto the surface of the substrate to be smoothed by ejecting the composition, and then scrub the surface having the composition supplied thereon with a brush.

From the same viewpoint, a more preferable scrubbing method is to supply the composition onto a surface of the substrate to be smoothed by ejecting the composition under application of ultrasonic vibrations and scrubbing the surface having the composition supplied thereon with a brush.

As means for supplying the composition onto the surface of the substrate to be smoothed, means such as a spray nozzle can be used, for example. As the brush, for example, a cleaning brush used in an ordinary cleaning step can be used. Specifically, a nylon brush, a PVA (polyvinyl alcohol) sponge brush, or the like can be used. The frequency of the ultrasonic waves may be, for example, the same as the value preferably adopted in the above-described immersion method.

For the smoothing in the step 1, the same methods as those used in known cleaning methods such as swing cleaning, cleaning that utilizes rotation of a spinner or the like, and paddle cleaning may be used in addition to the immersion and/or scrubbing described above. In one or more embodiments, the smoothing in step 1 does not use cleaning tape.

In the step 1, a plurality of substrates to be smoothed may be smoothed either one by one or altogether at once. The number of tanks used for the smoothing may be one, or two or more.

In one or more embodiments, from the viewpoint of obtaining a high-quality platter, the step 1 is preferably a step of bringing the composition according to the present disclosure into contact with a substrate to be smoothed and rinsing the substrate using an aqueous solvent such as water, and more preferably is a step of bringing the composition according to the present disclosure into contact with the substrate to be smoothed, rinsing the substrate using an aqueous solvent such as water, and drying the substrate.

[Step 2]

Step 2 is a step of forming a magnetic layer on the substrate obtained in the step 1 (magnetic layer forming step).

In the step 2, the magnetic layer can be formed by, for example, forming a magnetic layer that has a magnetic recording area and includes a metal thin film on a hard disk substrate through sputtering or the like. However, the magnetic layer forming step is not limited thereto. The metal material forming the metal thin film may be, for example, an alloy of cobalt with chromium, tantalum, platinum, or the like, an alloy of iron and platinum, or the like. The magnetic layer may be formed on both or one of the principal surface sides of the hard disk substrate.

In the production method of the present disclosure, the step 1 is preferably performed immediately before the step 2 from the viewpoint of obtaining the effects of the present disclosure. Also, in the production method of the present disclosure, the step 1 and the step 2 are preferably performed continuously in this order from the viewpoint of obtaining the effects of the present disclosure. Then, in the production method of the present disclosure, the length of time from the completion of the step 1 until the start of the step 2 is preferably 12 hours or less, more preferably 3 hours or less, and still more preferably 1 hour from the viewpoint of obtaining the effects of the present disclosure

[Hard Disk Storage Device]

A hard disk storage device with high recording density can be provided by using an aluminum platter produced by the production method of the present disclosure as a recording medium of the hard disk storage device. As the recording system, horizontal magnetic recording, perpendicular magnetic recording, or shingled magnetic recording may be used.

The present disclosure further relates to one or more embodiments to be described below.

<1> A method for producing an aluminum platter, the method including the following steps 1 and 2;

step 1; bringing a composition containing a compound (component A) that has at least one structure represented by the following formula (I) and has a molecular weight between 50 and 100,000 inclusive into contact with a substrate surface of a Ni—P plated aluminum alloy substrate; and step 2; forming a magnetic layer on the substrate obtained in the step 1, where, in the formula (I), $R^1$ is at least one selected from an ethylene group, a propylene group, and an isopropylene group, and * represents a bond.

<2> The method for producing an aluminum platter according to <1>, wherein the step 1 is a step of bringing the composition containing the component A into contact with the substrate, rinsing the substrate with an aqueous solvent, and drying the substrate.

<3> The method for producing an aluminum platter according to <1> or <2>, wherein the composition containing the component A is an aqueous solution.

<4> The method for producing an aluminum platter according to any one of <1> to <3>, wherein the Ni—P plated aluminum alloy substrate has a diminished smoothness as compared with that immediately after being polished.

<5> The method for producing an aluminum platter according to any one of <1> to <4>, wherein the composition containing the component A is a smoothing agent composition for smoothing a surface of the substrate on which a magnetic layer is to be formed.

<6> The method for producing an aluminum platter according to any one of <1> to <5>, wherein, in the component A, the number of nitrogen atoms in a molecule is two or more.

<7> The method for producing an aluminum platter according to any one of <1> to <6>, wherein, in the component A, the number of nitrogen atoms in a molecule is preferably 1300 or less, more preferably 1000 or less, still more preferably 100 or less, yet more preferably 10 or less, and even more preferably 4 or less.

<8> The method for producing an aluminum platter according to any one of <1> to <7>, wherein, in the component A, the number of amino groups in a molecule is preferably one or more and more preferably two or more.

<9> The method for producing an aluminum platter according to any one of <1> to <8>, wherein, in the component A, the number of amino groups in a molecule is preferably 500 or less, more preferably 30 or less, and still more preferably 10 or less.

<10> The method for producing an aluminum platter according to any one of <1> to <9>, wherein the component A is at least one selected from a compound represented by the following formula (II) and polyethyleneimine:

(II)

where, in the formula (II), $R^1$ is at least one selected from an ethylene group, a propylene group, and an isopropylene group, and $R^2$ and RP are each independently at least one selected from a hydrogen atom, a methyl group, an ethyl group, a hydroxymethyl group, a hydroxyethyl group, a hydroxypropyl group, an aminoethyl group, an aminopropyl group, and a —$(CH_2)_2NH(CH_2)_2NH_2$ group.

<11> The method for producing an aluminum platter according to any one of <1> to <10>, wherein a molecular weight of the component A is between 50 and 100,000 inclusive, preferably 70,000 or less, more preferably 10,000 or less, still more preferably 2,000 or less, and yet more preferably 1,000 or less.

<12> The method for producing an aluminum platter according to any one of <1> to <11>, wherein, when the component A is polyethyleneimine, a weight-average molecular weight of the component A is preferably 50 or more.

<13> The method for producing an aluminum platter according to any one of <1> to <12>, wherein, when the component A is polyethyleneimine, a weight-average molecular weight of the component A is preferably 70,000 or less, more preferably 10,000 or less, and still more preferably 2,000 or less.

<14> The method for producing an aluminum platter according to any one of <1> to <13>, wherein a content of the component A when the composition containing the component A is in use is preferably 0.01 mass % or more, more preferably 0.03 mass % or more, and still more preferably 0.1 mass % or more.

<15> The method for producing an aluminum platter according to any one of <1> to <14>, wherein a content of the component A when the composition containing the component A is in use is preferably 1.0 mass % or less, more preferably 0.5 mass % or less, still more preferably 0.3 mass % or less, and yet more preferably 0.2 mass % or less.

<16> The method for producing an aluminum platter according to any one of <1> to <15>, wherein a content of the component A when the composition containing the component A is in use is preferably between 0.01 mass % and 1.0 mass % inclusive, more preferably 0.03 mass % and 0.5 mass % inclusive, still more preferably 0.1 mass % and 0.3 mass % inclusive, and yet more preferably 0.1 mass % and 0.2 mass % inclusive.

<17> The method for producing an aluminum platter according to any one of <1> to <16>, wherein a content of the component A when the composition containing the component A is in use is preferably 0.01 mass % or more, more preferably 0.03 mass % or more, and still more preferably 0.05 mass % or more.

<18> The method for producing an aluminum platter according to any one of <1> to <17>, wherein a content of the component A when the composition containing the component A is in use is preferably 1.0 mass % or less, more preferably 0.5 mass % or less, still more preferably 0.3 mass % or less, and yet more preferably 0.1 mass % or less.

<19> The method for producing an aluminum platter according to any one of <1> to <18>, wherein a content of the component A when the composition containing the component A is in use is preferably between 0.01 mass % and 1.0 mass % inclusive, more preferably 0.03 mass % and 0.5 mass % inclusive, still more preferably 0.05 mass % and 0.3 mass % inclusive, and yet more preferably 0.05 mass % and 0.1 mass % inclusive.

<20> The method for producing an aluminum platter according to any one of <1> to <19>, wherein the composition containing the component A further contains a chelating agent (component B).

<21> The method for producing an aluminum platter according to <20>, wherein a content of the component B when the composition containing the component A is in use is preferably 0.001 mass % or more, more preferably 0.005 mass % or more, and still more preferably 0.01 mass % or more.

<22> The method for producing an aluminum platter according to <20> or <21>,
wherein a content of the component B when the composition containing the component A is in use is preferably 0.2 mass % or less, more preferably 0.1 mass % or less, still more preferably 0.05 mass % or less, and even more preferably 0.02 mass % or less.

<23> The method for producing an aluminum platter according to any one of <20> to <22>,
wherein a content of the component B when the composition containing the component A is in use is preferably between 0.001 mass % and 0.2 mass % inclusive, more preferably 0.005 mass % and 0.1 mass % inclusive, still more preferably 0.01 mass % and 0.05 mass % inclusive, and yet more preferably 0.01 mass % and 0.02 mass % inclusive.

<24> The method for producing an aluminum platter according to any one of <1> to <23>,
wherein the composition containing the component A further contains water (component C).

<25> The method for producing an aluminum platter according to <24>,
wherein a content of the component C when the composition containing the component A is in use is preferably 90 mass % or more, more preferably 95 mass % or more, and still more preferably 99 mass % or more.

<26> The method for producing an aluminum platter according to <24> or <25>,
wherein a content of the component C when the composition containing the component A is in use is preferably 99.99 mass % or less, more preferably 99.9 mass % or less, and still more preferably 99.8 mass % or less.

<27> The method for producing an aluminum platter according to any one of <1> to <26>,
wherein the composition containing the component A further contains an alkali agent (component D) other than the component A.

<28> The method for producing an aluminum platter according to any one of <1> to <27>,
wherein a pH of the composition containing the component A in use is preferably 9 or more, more preferably 9.5 or more, still more preferably 10 or more, yet more preferably 10.5 or more, and even more preferably 11.8 or more.

<29> The method for producing an aluminum platter according to any one of <1> to <28>,
wherein a pH of the composition containing the component A in use is preferably 14 or less, more preferably 13 or less, and still more preferably 12.5 or less.

<30> The method for producing an aluminum platter according to any one of <1> to <29>,
wherein a pH of the composition containing the component A in use is preferably between 9 and 14 inclusive, more preferably between 9.5 and 14 inclusive, still more preferably between 10 and 14 inclusive, yet more preferably between 10.5 and 14 inclusive, even more preferably between 11.8 and 14 inclusive, even more preferably between 11.8 and 13 inclusive, and even more preferably between 11.8 and 12.5 inclusive.

<31> The method for producing an aluminum platter according to any one of <1> to <30>,
wherein the composition containing the component A is substantially free of at least one selected from a compound having an aromatic sulfonic acid group, an anionic surfactant, a nonionic surfactant, and an abrasive.

<32> The method for producing an aluminum platter according to any one of <1> to <31>,
wherein the composition containing the component A further contains a chelating agent (component B), water (component C), and an alkali agent (component D) other than the component A, and
the composition is composed of the component A, the component B, the component C, and the component D.

<33> The method for producing an aluminum platter according to any one of <1> to <32>,
wherein the substrate in the step 1 has an oxidized substrate surface.

<34> The method for producing an aluminum platter according to any one of <1> to <29>,
wherein the substrate in the step 1 is a substrate after one hour or more has elapsed from being polished.

<35> The method for producing an aluminum platter according to any one of <1> to <34>,
wherein the step 1 is performed immediately before the step 2.

<36> The method for producing an aluminum platter according to any one of <1> to <35>,
wherein the step 1 and the step 2 are performed continuously in this order.

<37> The method for producing an aluminum platter according to any one of <1> to <36>,
wherein the length of time from the completion of the step 1 until the start of the step 2 is preferably 12 hours or less, more preferably 3 hours or less, and still more preferably 1 hour or less.

<38> A smoothing agent composition for smoothing a surface of a substrate on which a magnetic layer is to be formed, the smoothing agent including
a compound (component A) that has at least one structure represented by the following formula (I) and has a molecular weight between 50 and 100,000 inclusive, where, in the formula (I), $R^1$ is at least one selected from an ethylene group, a propylene group, and an isopropylene group, and * represents a bond.

<39> A method for smoothing a surface of a substrate using the smoothing agent composition according to <38>.

EXAMPLES

The present disclosure will be described more specifically below by way of examples. It is to be noted, however, that these examples do not limit the present disclosure by any means 1. Preparation of Compositions (Examples 1 to 24 and Comparative Examples 1 to 10)

Components shown in Tables 1 to 3 were blended at the ratios shown in Tables 1 to 3 (mg/kg, effective content) and mixed together to prepare 4 kg of compositions of Examples 1 to 24 and Comparative Examples 1 to 10. The indicated pH is the pH of each composition at 25° C., which was read from a pH meter (DKK-TOA CORPORATION, HM-30G) three minutes after dipping the electrode of the pH meter into the composition.

The following components were used as the components of the compositions.

<Component A>
N-(β-aminoethyl)ethanolamine (Nippon Nyukazai Co., Ltd., Aminoalcohol EA)
N-(β-aminoethyl)isopropanolamine (Nippon Nyukazai Co., Ltd., Aminoalcohol PA)
ethylenediamine (Wako Pure Chemical Industries, Ltd., special grade)
N-ethylethylenediamine (Tokyo Chemical Industry Co., Ltd.)
1,2-propanediamine (Wako Pure Chemical Industries, Ltd., first grade)
1,3-propanediamine (Wako Pure Chemical Industries, Ltd., first grade)
N,N-bis(aminopropyl)methylamine (Wako Pure Chemical Industries, Ltd., special grade)
diethylenetriamine (Tokyo Chemical Industry Co., Ltd.)
triethylenetetramine (Merck & Co., Inc.)
polyethyleneimine (Wako Pure Chemical Industries, Ltd., average molecular weight: approximately 600)
polyethyleneimine (Wako Pure Chemical Industries, Ltd., average molecular weight: approximately 1800)
polyethyleneimine (Wako Pure Chemical Industries, Ltd., average molecular weight: approximately 10000)
30% polyethyleneimine P-70 solution (Wako Pure Chemical Industries, Ltd., average molecular weight: approximately 70000)

<Non-Component A>
2-aminoethanol (Nippon Shokubai Co., Ltd., Monoethanolamine)
1-amino-2-propanol (Mitsui Fine Chemicals, Inc., Monoisopropanolamine)
diethanolamine (Wako Pure Chemical Industries, Ltd., Diethanolamine (DEA))
triethanolamine (Kishida Chemical Co., Ltd., 2,2',2"-Nitrilotriethanol)
imidazole (Wako Pure Chemical Industries, Ltd., special grade)
o-phenylenediamine (Wako Pure Chemical Industries, Ltd., first grade)
1,4-butanediamine (Wako Pure Chemical Industries, Ltd., first grade)
piperazine (Wako Pure Chemical Industries, Ltd., special grade)
guanidine (Wako Pure Chemical Industries, Ltd., Guanidine Hydrochloride, special grade)

<Component B>
1-hydroxyethane-1,1-diphosphonic acid (Italmatch Japan Ltd., Dequest 2010, solid content: 60 mass %)
citric acid (Wako Pure Chemical Industries, Ltd., special grade)
glycine (Wako Pure Chemical Industries, Ltd., special grade)
ethylenediaminetetraacetic acid (Tokyo Chemical Industry Co., Ltd.,
ethylenediaminetetraacetic Acid Tetrasodium Salt Dihydrate)
diethylenetriaminepentaacetic acid (Wako Pure Chemical Industries, Ltd.,
diethylenetriamine-N,N,N',N",N"-Pentaacetic Acid)
acetylacetone (Wako Pure Chemical Industries, Ltd., special grade)
thioglycolic acid (Tokyo Chemical Industry Co., Ltd.)
gluconic acid (Wako Pure Chemical Industries, Ltd., Sodium Gluconate, special grade)

<Other Components>
potassium hydroxide (Kanto Chemical Co., Inc., special grade guaranteed by Kanto Chemical Co., Inc., solid content: 48 mass %)
ultrapure water produced using a continuous pure water production apparatus (PURECONTI PC-2000 VRL) and a subsystem (MAKUACE KC-05H) manufactured by Kurita Water Industries, Ltd.

2. Evaluation Method

[Smoothing Test Method]

As substrates to be smoothed, Ni—P plated aluminum alloy substrates (outer diameter: 95 mmφ, inner diameter: 20 mmφ, thickness: 1.25 mm, surface roughness Ra: 1.20 Å) that had been left to stand at 25° C. for 72 hours were prepared. The surface roughness Ra of the substrates before the smoothing test was 1.40 Å. Then, the substrates to be smoothed were smoothed using the respective compositions to evaluate smoothing performance of the respective compositions. The substrates were smoothed in the following manner.

(Smoothing Step)

Three substrates to be smoothed were smoothed using a processing apparatus under the following conditions. One immersion tank set and two rinsing tank sets were prepared.
(1) Immersion 1: Each of the prepared compositions of Examples 1 to 24 and Comparative Examples 1 to 10 was added to the immersion tank (a), and the liquid temperature in the immersion tank (a) was set to 25° C. Then, the substrates to be smoothed were immersed in the composition in the immersion tank (a), and ultrasonic waves (200 kHz) were applied thereto. The immersion time was set to 2 minutes or 10 minutes.
(2) Rinsing 1: Ultrapure water was poured into the rinsing tank (b), and the liquid temperature in the rinsing tank (b) was set to 25° C. Then, the substrates to be smoothed in the immersion tank (a) were transferred to the rinsing tank (b) to be immersed in the ultrapure water in the rinsing tank (b), and rinsed for 2 minutes under application of ultrasonic waves (600 kHz).
(3) Rinsing 2: Ultrapure water was poured into the rinsing tank (c), and the liquid temperature in the rinsing tank (c) was set to 25° C. Then, the substrates to be smoothed in the rinsing tank (b) were transferred to the rinsing tank (c) and immersed in the ultrapure water in the rinsing tank (c), and rinsed for 2 minutes under application of ultrasonic waves (900 kHz).
(4) Drying: The substrates to be smoothed were transferred to a spin dryer and dried at 700 rpm for 1 minute to completely dry their surfaces.

<Method for Evaluating Smoothness Improvement Rate>

The surface roughness Ra of each of the substrates treated under the above conditions for evaluation was measured using an AFM (manufactured by Bruker, Dimension Icon). The surface roughness Ra of each substrate after being smoothed was compared with the surface roughness Ra before being smoothed, and the smoothness improvement rate was calculated as per the following equation. It can be determined that the larger the value, the more improved the smoothness.

Smoothness improvement rate (%)=([Ra of substrate before being smoothed]−[Ra of substrate after being smoothed])÷[Ra of substrate before being smoothed]×100

<NiO Solubility>

20.0 g of each of the compositions shown in Tables 1 to 3 was added to a 50 mL polypropylene bottle, and 0.1 g of nickel oxide (II) particles [Wako Pure Chemical Industries, Ltd., Nickel Oxide (II), 99.9%] was added thereto. Using a rotor [fluorine resin (PTFE), ϕ5 mm×15 mm], the resultant mixture was stirred for 10 minutes at 500 rpm. Thereafter, the mixture was filtered through a filter (Toyo Roshi Kaisha, Ltd., DISMIC-25 HP020AN, pore size: 0.20 μm) to collect a test solution. The test solution was diluted with ultrapure water to set the nickel ion concentration to 2 mg/kg or less, and the emission intensity of the nickel was measured using an ICP emission analyzer (PerkinElmer, Inc., Optima 5300) to determine the Ni concentration in the test solution. Then, the amount of the dissolved NiO was calculated as per the following equation. It can be determined that the larger the value, the more improved the smoothness.

Amount of dissolved NiO (mg/kg)=$A \times B \times C \div D$

A: Ni concentration (mg/kg) determined using ICP emission analyzer
B: Dilution factor of test solution with ultrapure water
C: Molecular weight of NiO (74.69 g/mol)
D: Atomic weight of Ni (58.6934)

TABLE 1

| Table 1 | | $R^1$ | N (Number) | Amino Groups (Number) | Molecular Weight | Comp. Ex. 1 | Example 1 | 2 | 3 | 4 | 5 | 6 | 7 |
|---|---|---|---|---|---|---|---|---|---|---|---|---|---|
| Component A | N-(β-aminoethyl) ethanolamine | Ethylene | 2 | 1 | 104 | | 375 | 750 | 1500 | 1500 | | | |
| | N-(β-aminoethyl) isopropandamine | Ethylene | 2 | 1 | 118 | | | | | | 1500 | | |
| | Ethylenediamine | Ethylene | 2 | 2 | 60 | | | | | | | 1500 | |
| | N-ethylethylenediamine | Ethylene | 2 | 1 | 88 | | | | | | | | 1500 |
| | 1,2-propanediamine | Isopropylene | 2 | 2 | 74 | | | | | | | | |
| | 1,3-propanediamine | Propylene | 2 | 2 | 74 | | | | | | | | |
| | N,N-bis(aminopropyl) methylamine | Propylene | 3 | 2 | 145 | | | | | | | | |
| | Diethylenetriamine | Ethylene | 3 | 2 | 103 | | | | | | | | |
| | Triethylenetetramine | Ethylene | 4 | 2 | 146 | | | | | | | | |
| | Polyethyleneimine | Ethylene | 12 | ≤2 | Average 600 | | | | | | | | |
| | Polyethyleneimine | Ethylene | 34 | ≤2 | Average 1800 | | | | | | | | |
| | Polyethyleneimine | Ethylene | 186 | ≤2 | Average 10000 | | | | | | | | |
| | Polyethyleneimine | Ethylene | 1297 | ≤2 | Average 70000 | | | | | | | | |
| D | Potassium hydroxide | | | | | 446 | 446 | 446 | | 446 | 446 | 416 | 446 |
| C | Ultrapure water | | | | | * | * | * | * | * | * | * | * |
| | pH | | | | | 12.0 | 12.0 | 12.0 | 10.9 | 12.1 | 12.1 | 12.1 | 12.1 |
| | Smoothness Improvement Rate (Immersion time: 10 min)(%) | | | | | −0.75 | 8.71 | 9.70 | 9.40 | 8.96 | 9.76 | 9.04 | 9.61 |
| | Smoothness Improvement Rate (Immersion time: 2 min)(%) | | | | | −0.18 | 6.01 | 7.90 | 8.13 | 8.50 | 8.33 | 8.19 | 8.06 |
| | NO solubility (mg/kg) | | | | | 0.17 | 1.66 | 2.62 | 5.56 | 4.34 | 3.99 | 8.45 | 2.09 |

TABLE 1-continued

| Table 1 | | | Examples | | | | | |
|---|---|---|---|---|---|---|---|---|
| | | | 8 | 9 | 10 | 11 | 12 | 13 |
| Component A | N-(β-aminoethyl) ethanolamine | | | | | | | |
| | N-(β-aminoethyl) isopropandamine | | | | | | | |
| | Ethylenediamine | | | | | | | |
| | N-ethylethylene diamine | | | | | | | |
| | 1.2-propanediamine | | 1500 | | | | | |
| | 1.3-propanediamine | | | 1500 | | | | |
| | N,N-bis(aminopropyl) methylamine | | | | 1500 | | | |
| | Diethylenetriamine | | | | | 1500 | | |
| | Triethylenetetramine | | | | | | 1500 | |
| | Polyethyleneimine | | | | | | | 1500 |
| | Polyethyleneimine | | | | | | | |
| | Polyethyleneimine | | | | | | | |
| | Polyethyleneimine | | | | | | | |
| D | Potassium hydroxide | | 446 | 446 | 446 | 446 | 446 | 446 |
| C | Ultrapure water | | * | * | * | * | * | * |
| | pH | | 12.0 | 12.0 | 12.0 | 12.1 | 12.0 | 12.0 |
| | Smoothness Improvement Rate (Immersion time: 10 min)(%) | | 9.88 | 8.62 | 8.05 | 9.63 | 9.01 | 9.00 |
| | Smoothness Improvement Rate (Immersion time: 2 min)(%) | | 8.05 | 6.28 | 5.87 | 7.95 | 7.83 | 8.04 |
| | NO solubility (ng/kg) | | 7.17 | 1.09 | 0.89 | 6.84 | 3.40 | 2.41 |

| Table 1 | | | Example | | |
|---|---|---|---|---|---|
| | | | 14 | 15 | 16 |
| Comparison A | N-(β-aminoethyl) ethanolamine | | | | |
| | N-(β-aminoethyl) | | | | |

TABLE 1-continued

| | | | | |
|---|---|---|---|---|
| | isopropandamine | | | |
| | Ethylenediamine | | | |
| | N-ethylethylenediamine | | | |
| | 1.2-propanediamine | | | |
| | 1.3-propanediamine | | | |
| | N,N-bis(aminopropyl)methylamine | | | |
| | Diethylenetriamine | | | |
| | Triethylenetetramine | | | |
| | Polyethyleneimine | 1500 | | |
| | Polyethyleneimine | | 1500 | |
| | Polyethyleneimine | | | 1500 |
| D | Potassium hydroxide | 446 | 446 | 446 |
| C | Ultrapure water | * | * | * |
| | pH | 12.0 | 11.9 | 12.0 |
| | Smoothness Improvement Rate (Immersion time: 10 min)(%) | 8.77 | 9.56 | 9.08 |
| | Smoothness Improvement Rate (Immersion time: 2 min)(%) | 6.17 | 6.24 | 7.81 |
| | NO solubility (ng/kg) | 1.33 | 1.94 | 2.01 |

*Remainder

TABLE 2

| Table 2 | | $R^1$ | N (Number) | Amino Groups (Number) | Molecular Weight | Example 1 | 17 | 18 | 19 | 20 | 21 | 22 | 23 | 24 |
|---|---|---|---|---|---|---|---|---|---|---|---|---|---|---|
| Component A | N-(β-aminoethyl)ethanolamine | Ethylene | 2 | 1 | 104 | 375 | 375 | 375 | 375 | 375 | 375 | 375 | 375 | 375 |
| Component B | 1-hydroxyethylidene-1,1-diphosphoric acid | | | | | | 150 | | | | | | | |
| | Citric acid | | | | | | | 150 | | | | | | |
| | Glycine | | | | | | | | 150 | | | | | |
| | Ethylenediaminetetracetic acid | | | | | | | | | 150 | | | | |
| | Diethylenetriaminepentacetic acid | | | | | | | | | | 150 | | | |
| | Acetylacetone | | | | | | | | | | | 150 | | |
| | Thioglycolic acid | | | | | | | | | | | | 150 | |
| | Gluconic acid | | | | | | | | | | | | | 150 |

TABLE 2-continued

| Table 2 | | N R¹ | Amino Groups (Number) | Molecular Weight | Example 1 | 17 | 18 | 19 | 20 | 21 | 22 | 23 | 24 |
|---|---|---|---|---|---|---|---|---|---|---|---|---|---|
| | | (Number) | | | | | | | | | | | |
| Component D | Potassium hydroxide | | | | 446 | 676 | 590 | 600 | 446 | 550 | 556 | 657 | 489 |
| Component C | Ultrapure water | | | | * | * | * | * | * | * | * | * | * |
| pH | | | | | 12.0 | 12.0 | 12.0 | 12.0 | 12.0 | 12.0 | 12.0 | 12.0 | 12.0 |
| Smoothness Improvement Rate (Immersion time: 10 min) (%) | | | | | 8.71 | 8.92 | 9.15 | 9.57 | 9.62 | 8.95 | 8.92 | 9.17 | 9.14 |
| Smoothness Improvement Rate (Immersion time: 2 min) (%) | | | | | 6.01 | 9.03 | 8.90 | 9.25 | 9.61 | 9.34 | 8.82 | 9.07 | 9.18 |
| NO solubility (mg/kg) | | | | | 1.66 | 4.49 | 2.16 | 3.47 | 5.31 | 5.19 | 2.55 | 5.65 | 2.91 |

*Remainder

TABLE 3

| Table 3 | | R¹ | N (Number) | Amino Groups (Number) | Molecular Weight | Example 4 | Comparative Example 1 | 2 | 3 | 4 | 5 |
|---|---|---|---|---|---|---|---|---|---|---|---|
| Component A | N-(β-amino-ethyl)ethanolamine | ethylene | 2 | 1 | 104 | 1500 | | | | | |
| Non-Component A | 2-aminoethanol | — | 1 | 1 | 61 | | 1500 | | | | |
| | 1-amino-2-propanol | — | 1 | 1 | 75 | | | 1500 | | | |
| | Diethanolamine | — | 1 | 0 | 105 | | | | 1500 | | |
| | Triethanolamine | — | 1 | 0 | 149 | | | | | 1500 | |
| | Imidazole | — | 2 | 0 | 60 | | | | | | |
| | αphenylenediamine | Phenylene | 2 | 2 | 108 | | | | | | |
| | 1,4-butanediamine | Butylene | 2 | 2 | 88 | | | | | | |
| | Piperazine | — | 2 | 0 | 86 | | | | | | |
| | Guanidine | — | 3 | 2 | 59 | | | | | | |
| Component D | Potassium hydroxide | | | | | 446 | 446 | 446 | 446 | 446 | 446 |
| Component C | Ultrapure water | | | | | * | * | * | * | * | * |
| pH | | | | | | 12.1 | 12.0 | 12.0 | 12.1 | 12.1 | 12.1 |
| Smoothness Improvement Rate (immersion time: 10 min) (%) | | | | | | 8.96 | −0.75 | 0.00 | 0.00 | 0.18 | −0.20 |
| Smoothness Improvement Rate (immersion time: 2 min) (%) | | | | | | 8.50 | −0.18 | 0.20 | 0.24 | 0.01 | −0.75 |
| NO solubility (mg/kg) | | | | | | 4.31 | 0.17 | 0.12 | 0.16 | 0.17 | 0.16 |

| Table 3 | | Comparative Example 6 | 7 | 8 | 9 | 10 |
|---|---|---|---|---|---|---|
| Component A | N-(β-amino-ethyl)ethanolamine | | | | | |
| Non-Component A | 2-aminoethanol | | | | | |
| | 1-amino-2-propanol | | | | | |
| | Diethanolamine | | | | | |
| | Triethanolamine | | | | | |
| | Imidazole | 1500 | | | | |
| | αphenylenediamine | | 1500 | | | |
| | 1,4-butanediamine | | | 1500 | | |
| | Piperazine | | | | 1500 | |
| | Guanidine | | | | | 1500 |
| Component D | Potassium hydroxide | 446 | 446 | 446 | 446 | 446 |
| Component C | Ultrapure water | * | * | * | * | * |
| pH | | 12.1 | 12.1 | 12.0 | 12.0 | 11.9 |
| Smoothness Improvement Rate (immersion time: 10 min) (%) | | 0.11 | −0.70 | 0.43 | 0.08 | −0.30 |
| Smoothness Improvement Rate (immersion time: 2 min) (%) | | 0.29 | 0.27 | −0.29 | 0.20 | 0.06 |
| NO solubility (mg/kg) | | 0.17 | 0.21 | 0.22 | 0.24 | 0.20 |

*Remainder

As can be seen from Tables 1 and 2, by using the compositions of Examples 1 to 24, the smoothness of the substrate surfaces was improved as compared with the case where the compositions of Comparative Examples 1 to 10 were used.

Further, using the composition of Example 4, a smoothing test was further performed on the following substrates to be smoothed. The smoothing test and the method for evaluation were the same as those described above, except that the following substrates to be smoothed were used and the immersion time in the composition was set to two minutes.

As the substrates to be smoothed, Ni—P plated aluminum alloy substrates (outer diameter: 95 mmφ, inner diameter: 20 mmφ, thickness: 1.25 mm, surface roughness Ra: 1.20 Å)

that had been left to stand at 25° C. for 24 hours were used. The surface roughness Ra (before the smoothing test) of the substrates that had been left to stand for 24 hours was 1.30 Å. These substrates were smoothed using the composition of Example 4. The surface roughness Ra of the substrates after being smoothed (after the smoothing test) was 1.20 Å. The smoothness improvement rate was calculated to be 7.69%, which indicates that the smoothness of the substrate surfaces was improved.

The invention claimed is:

1. A method for producing an aluminum platter, the method comprising the following steps 1 and 2, and conducting the step 1 immediately before the step 2:

step 1: bringing a composition containing a compound (component A) that has at least one structure represented by the following formula (I) and has a molecular weight between 50 and 100,000 inclusive into contact with a substrate surface of a Ni—P plated aluminum alloy substrate; and step 2: forming a magnetic layer on the substrate obtained in the step 1, (I)

where, in the formula (I), $R^1$ is at least one selected from an ethylene group, a propylene group, and an isopropylene group, and * represents a bond.

2. The method for producing an aluminum platter according to claim 1, wherein the step 1 is a step of bringing the composition containing the component A into contact with the substrate, rinsing the substrate with an aqueous solvent, and drying the substrate.

3. The method for producing an aluminum platter according to claim 1, wherein the composition containing the component A is an aqueous solution.

4. The method for producing an aluminum platter according to claim 1, wherein the Ni—P plated aluminum alloy substrate has been previously polished and has a diminished smoothness as compared with that immediately after being polished.

5. The method for producing an aluminum platter according to claim 1, wherein the composition containing the component A is a smoothing agent composition for smoothing a surface of the substrate on which a magnetic layer is to be formed.

6. The method for producing an aluminum platter according to claim 1, wherein the component A is at least one selected from a compound represented by the following formula (II) and polyethyleneimine, (II)

where, in the formula (II), $R^1$ is at least one selected from an ethylene group, a propylene group, and an isopropylene group, and $R^2$ and $R^3$ are each independently at least one selected from a hydrogen atom, a methyl group, an ethyl group, a hydroxymethyl group, a hydroxyethyl group, a hydroxypropyl group, an aminoethyl group, an aminopropyl group, and a —$(CH_2)_2NH(CH_2)_2NH_2$ group.

7. The method for producing an aluminum platter according to claim 1, wherein a pH of the composition containing the component A is between 9 and 14 inclusive.

8. The method for producing an aluminum platter according to claim 1, wherein a pH of the composition containing the component A is between 11.8 and 14 inclusive.

9. The method for producing an aluminum platter according to claim 1, wherein the composition containing the component A further contains a chelating agent (component B).

10. The method for producing an aluminum platter according to claim 1, wherein the composition containing the component A is substantially free of at least one selected from a compound having an aromatic sulfonic acid group, an anionic surfactant, a nonionic surfactant, and an abrasive.

11. The method for producing an aluminum platter according to claim 1, wherein the composition containing the component A further contains a chelating agent (component B), water (component C), and an alkali agent (component D) other than the component A, and the composition is composed of the component A, the component B, the component C, and the component D.

12. The method for producing an aluminum platter according to claim 1, wherein the substrate in the step 1 has an oxidized substrate surface.

13. The method for producing an aluminum platter according to claim 1, wherein the substrate in the step 1 is a substrate that has been previously polished one hour or more ago.

14. The method for producing an aluminum platter according to claim 1, wherein the step 1 and the step 2 are performed continuously in this order.

* * * * *